(12) United States Patent
Teggatz et al.

(10) Patent No.: US 6,864,702 B1
(45) Date of Patent: Mar. 8, 2005

(54) SYSTEM FOR OXIDE STRESS TESTING

(75) Inventors: Ross E. Teggatz, McKinney, TX (US); Reed W. Adams, Plano, TX (US); Suribhotla V. Rajasekhar, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/746,984

(22) Filed: Dec. 24, 2003

(51) Int. Cl.$^7$ .............................................. G01R 31/27
(52) U.S. Cl. ...................................................... 324/769
(58) Field of Search ................................ 324/456, 500, 324/512, 522, 523, 527, 531, 537, 763–766, 769; 438/5, 10, 11, 17, 18; 257/48

(56) References Cited

U.S. PATENT DOCUMENTS

| | | | | |
|---|---|---|---|---|
| 5,381,105 A | * | 1/1995 | Phipps ........................ | 324/765 |
| 5,598,102 A | * | 1/1997 | Smayling et al. ........... | 324/537 |
| 5,648,275 A | * | 7/1997 | Smayling et al. ............. | 438/18 |
| 5,798,649 A | * | 8/1998 | Smayling et al. ........... | 324/551 |
| 2004/0085084 A1 | * | 5/2004 | Wang et al. ................. | 324/765 |

* cited by examiner

Primary Examiner—Evan Pert
(74) Attorney, Agent, or Firm—J. Dennis Moore; W. James Brady III; Frederick J. Telecky, Jr.

(57) ABSTRACT

The present invention provides a system for stress testing an oxide structure to determine that structure's reliability in overstress conditions. The present invention provides an overstress test structure (400) that comprises a first transistor (406), having a first terminal coupled to ground, a second terminal coupled to a control signal (402), and a third terminal coupled to a first end of a first resistive element (412). A first voltage source (414) is coupled to the second end of the first resistive element. A second resistive element (416) is intercoupled between the second end of the first resistive element and ground. A second transistor (418) has a first terminal coupled to the second end of the first resistive element, a second terminal coupled to the first end of the first resistive element, and a third terminal coupled to a first node (420). A third resistive element (422) is intercoupled between the third terminal of the second transistor and ground; and a third transistor (424) has a first terminal coupled (426) to the oxide structure, a second terminal coupled to the first end of the first resistive elerment, and a third terminal coupled to a second voltage source (428).

27 Claims, 2 Drawing Sheets

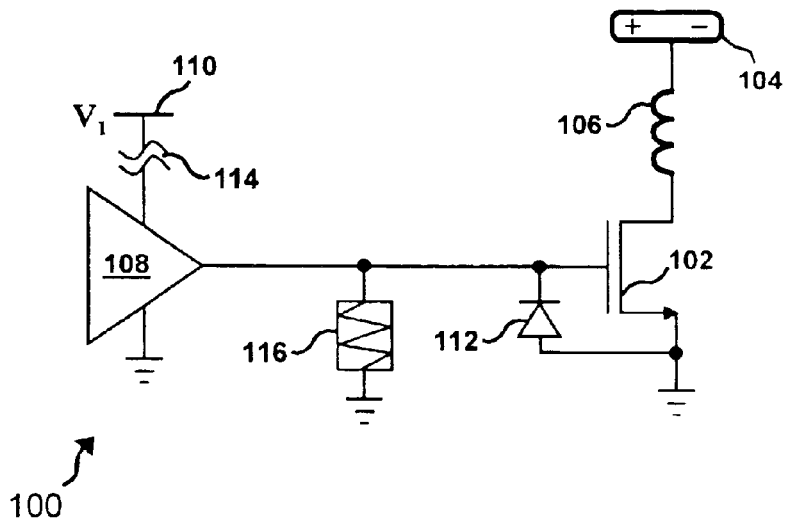
FIG. 1 (*Prior Art*)
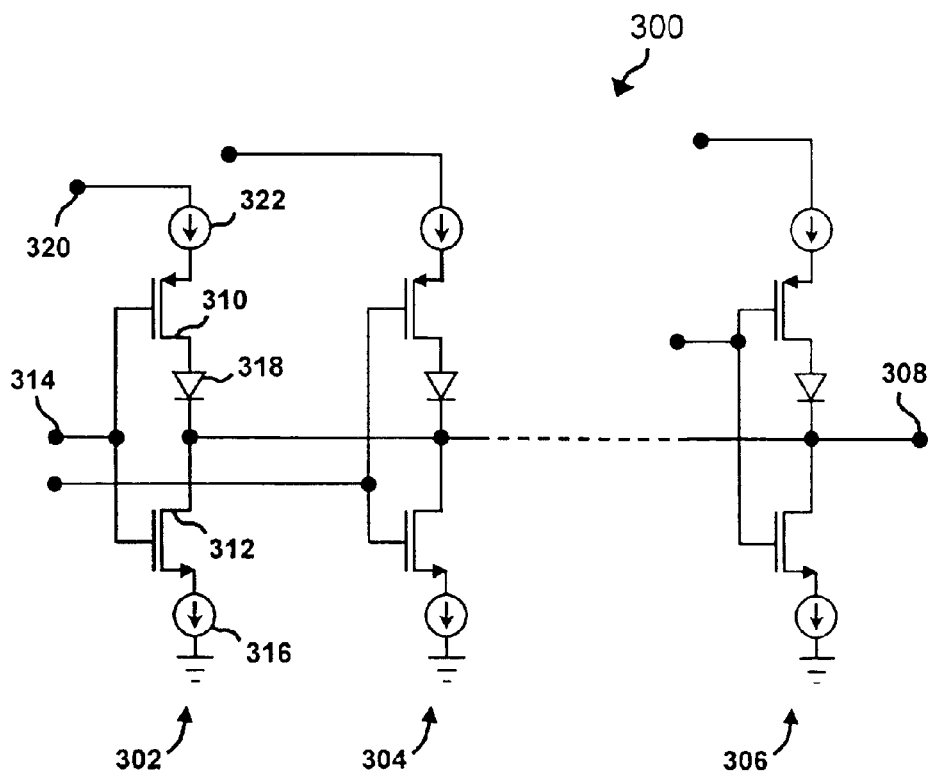
FIG. 3

SYSTEM FOR OXIDE STRESS TESTING

TECHNICAL FIELD OF THE INVENTION

The present invention relates generally to the field of semiconductor devices and, more particularly, to apparatus and methods for stress testing gate oxide integrity in semiconductor devices.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Every device must be smaller without damaging the operating characteristics of the integrated circuit devices. High packing density, low heat generation, low power consumption, and good reliability must be maintained without any functional device degradation.

Commonly, device manufacturers specify or define a number of boundary operational parameters (e.g., max/min voltage, max/min current, max/min temperature) within which a desired device reliability level may be achieved, or even guaranteed. For example, a semiconductor device may be guaranteed an operational life of 10 years if its supply voltage is maintained at or below 5 Volts over that life. Frequently, however, end equipment applications may, intentionally or not, require a semiconductor device to operate at some value outside the specified boundary parameters for a period (or periods) of time. This operational overstress may degrade the performance or lifetime of the device, or may cause complete device failure. In either case, system reliability is impacted significantly.

One such overstress problem, frequently encountered, involves over-voltage effects on semiconductor dielectrics—particularly oxides. Depending upon the structures and processes with which a device is formed, certain dielectric structures and substructures can be especially susceptible to over-voltage damage. Consider, for example, a gate oxide implemented in a MOSFET structure. Over-voltage operation can cause anomalies in a gate oxide (e.g., cracks, breaks)—anomalies that can alter or ruin the functionality of the FET.

As a result, devices utilized in such applications are often tested, either during production or immediately thereafter, to screen out devices that are likely to break down under certain over-voltage conditions. One such integrity screening involves measurement of leakage current through an oxide structure undergoing over-voltage stress. For example, a gate oxide structure may be stressed to some multiple (e.g., 125%, 150%, 200%) of the specified maximum voltage for that structure. Leakage currents through the gate structure are measured at various points throughout the stress test, and compared. If leakage current variations exceed some predetermined threshold, then the device is rejected.

Unfortunately, depending upon the specific circuitry implemented in the semiconductor device, there are often a number of device structures and substructures that interfere with or prevent the screening tests referenced above. Circuitry coupled to the gate of a FET (e.g., power-off discharge circuitry) can create alternative leakage paths that skew the outcome of an over-voltage stress test. Some devices may incorporate circuitry (e.g., Zener diode) that couples the gate and the source of a FET together—limiting the extent to which the gate oxide may be stressed. Certain devices lack blocking circuitry between the so gate and an operational supply that drives the gate during normal operation. Thus, during gate oxide testing, a current path exists that may charge the supply—again limiting the extent to which the gate oxide may be stressed.

As a result, there is a need for an oxide stress testing system that effectively and accurately assesses overstress integrity of oxide structures—providing reliable device characterization in an easy, efficient and cost-effective manner.

SUMMARY OF THE INVENTION

The present invention provides a versatile system of methods and structures that accurately characterize overstress behavior of oxide structures without altering device functionality—providing efficient and reliable assessment of semiconductor oxide integrity in an easy, efficient and cost-effective manner while overcoming limitations associated with previous approaches.

Specifically, the present invention provides circuitry that supplies a gate oxide overstress voltage (hereinafter referred to as overstress supply circuitry) that is independent of the operational gate supply. This circuitry may supply overstress voltage to a number of disparate FET structures—providing considerable space savings in device layout. The present invention further provides FET power-off discharge circuitry that may be implemented with the overstress supply circuitry or independent of such circuitry. The present invention provides this and other circuitry to remove alternative leakage paths during overstress testing while remaining operationally transparent during normal device operation—providing a more accurate and reliable overstress evaluation of a device.

More specifically, one embodiment of the present invention provides a circuit structure having a first transistor with a first terminal coupled to. ground, and a second terminal coupled to a first end of a load. A direct current source is coupled to a second end of the load; and a driver circuit is coupled to a third terminal of the first transistor and adapted to provide a specified voltage to the third terminal of the transistor. A passive disabling structure is intercoupled between the third terminal of the first transistor and ground. An overstress test structure, having a first node coupled to the passive disabling structure, and a second node coupled to the third terminal of the first transistor, is provided.

Another embodiment of the present invention provides an overvoltage test structure, for providing overstress testing of an oxide structure to which a passive disabling structure is coupled. The overvoltage test structure comprises a first transistor, having a first terminal coupled to ground, a second terminal coupled to a control signal source, and a third terminal coupled to a first end of a first resistive element. A first voltage source is coupled to a second end of the first resistive element. A second resistive element is intercoupled between the second end of the first resistive element and ground. A second transistor is provided, having a first terminal coupled to the second end of the first resistive element, a second terminal coupled to the first end of the first resistive element, and a third terminal coupled to the passive disabling structure. A third resistive element is intercoupled between the third terminal of the second transistor and ground; and a third transistor has a first terminal coupled to the oxide structure, a second terminal coupled to the first end of the first resistive element, and a third terminal coupled to a second voltage source The present invention also provides a method of over-voltage testing of an oxide structure, to which a passive disabling structure is coupled. The method provides a first transistor, having a first terminal coupled to ground, a second terminal coupled to a control signal source, and a third terminal coupled to a first end of a first resistive element. A first voltage source is coupled to a second end of the first resistive element, and a second resistive element is intercoupled between the second-end of the first resistive element and ground. A second transistor, having a first terminal coupled to the second end of the first resistive element, a second terminal coupled to the first end of the first resistive element, and a third terminal coupled to the passive disabling structure is provided. A third resistive element is intercoupled between the third terminal of the second transistor and ground. A third transistor, having a first terminal coupled to the oxide structure, a second terminal coupled to the first end of the first resistive element, and a third terminal coupled to a second voltage source is provided. The control signal provided by the control signal source is utilized to activate the first, second, and third transistors—applying the overvoltage to the oxide structure.

The present invention further provides a method of over-voltage testing an oxide structure, to which a passive disabling structure is coupled. The method measures leakage current through the oxide structure at a maximum specified voltage. An overstress testing circuit, adapted to provide an overstress voltage equivalent to some multiple of the maximum specified voltage, is provided. The overstress testing circuit is utilized to apply the overstress voltage to the oxide structure. The leakage current through the oxide structure is measured while the overstress voltage is applied. The oxide structure is then returned to the maximum specified voltage. The leakage current through the oxide structure is measured at the maximum specified voltage. The leakage currents measured are then assessed to determine whether differences therebetween exceed some desired threshold.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which:

FIG. 1 is an illustration of a PRIOR ART circuitry structure;

FIG. 3 is an illustration depicting one embodiment of a driver output structure according to the present invention.

DETAILED DESCRIPTION OF THE INVENTION

Figure 2:
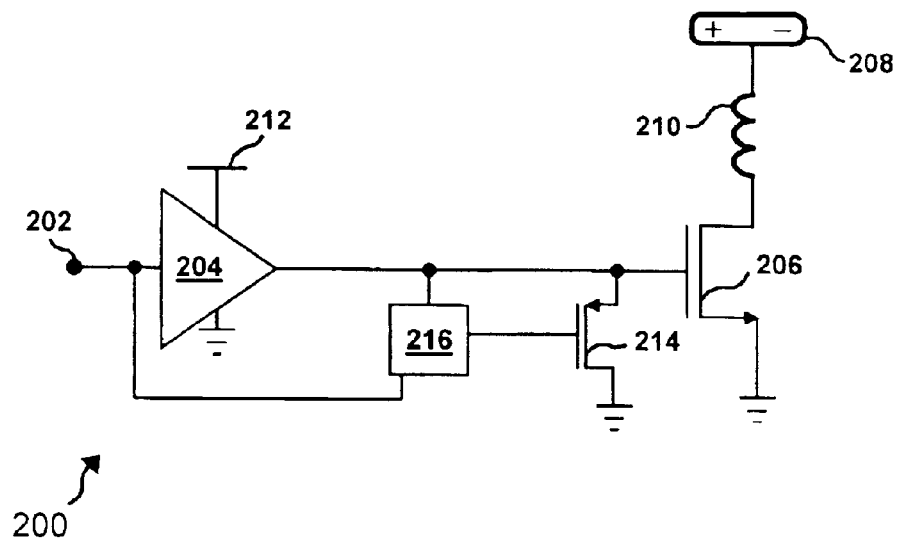
FIG. 2 is an illustration of one embodiment of a circuitry structure according to the present invention.

While the making and using of various embodiments of the present invention are discussed in detail below, it should-be appreciated that the present invention provides many applicable inventive concepts, which can be embodied in a wide variety of specific contexts. The invention will now be described in conjunction with the over-voltage testing of a gate oxide structure. The specific embodiments discussed herein are, however, merely illustrative of specific ways to make and use the invention and do not limit the scope of the invention.

The system of the present invention provides accurate characterization of oxide overstress behavior, without altering device functionality. Utilizing this system, efficient and reliable assessment of semiconductor oxide integrity is provided in an easy, efficient and cost-effective manner. Specifically, the present invention provides circuitry that supplies a gate oxide overstress voltage (hereinafter referred to as overstress supply circuitry) that is independent of the operational gate supply. This circuitry may supply overstress voltage to a number of disparate FET structures—providing considerable space savings in device layout. The present invention further provides FET power-off discharge circuitry that may be implemented with the overstress supply circuitry or independent of such circuitry. The present invention provides this and other circuitry to remove alternative leakage paths during overstress testing while remaining operationally transparent during normal device operation—providing a more accurate and reliable overstress evaluation of a device.

A large number of semiconductor devices are designed for applications that experience repeated power-up/power-down cycles. Many such applications rely on direct current sources, such as batteries, to supply power to some or all device structures. Depending on the specific circuitry utilized, certain power transitions (e.g., sudden loss of power) can cause device structures to continue to draw current from the direct current source—possibly overcharging or overstressing those structures, or draining the source (e.g., battery) completely. Further complications may arise, as previously mentioned, in certain end equipment applications (e.g., automotive circuitry systems) that can cause a semiconductor device to operate at some value outside its specified boundary parameters for a period (or periods) of time. Such operational overstress can degrade the performance or lifetime of the device, or may cause complete device failure.

Such complications are examined now in reference to prior art FIG. 1, which depicts a circuitry segment 100 that illustrates certain issues-addressed by the present invention. Segment 100 comprises a FET 102 coupled to a current source 104 through a load 106. For purposes of explanation and illustration, source 104 is depicted in segment 100 as a, battery, and load 106. is depicted as an inductor—although the principles and applications discussed herein are similarly applicable to other component structures. The drain of FET 102 is coupled to load 106, the source of FET 102 is coupled to ground, and the gate of FET 102 is coupled to a driver circuit 108. Driver 108 is coupled to ground and is powered by voltage supply 110 ($V_1$), which may be coupled—directly or indirectly—to source 104. A clamping structure 112, depicted as a Zener diode, is intercoupled between the gate and source of FET 102.

During normal operation, driver 108 provides power to the gate of FET 102 for cycling the FET on and off. If for some reason (e.g., short circuit, component damage), however, a break 114 in the power to driver 108 was to occur while FET 102 was on, the FET would remain in the on state while other surrounding circuitry shut off. The capacitive nature of the gate of FET 102 would maintain FET 102 in an on state. Thus, FET 102 would continue to draw current from battery 104 through load 106, saturating load 106. Over time, this condition would drain battery 104—a particularly undesirable result in many applications.

As a result, a number of devices incorporate some sort of passive disabling circuitry 116, between the. gate of FET 102 and ground, to provide a discharge path under in such a circumstance. Should a break 114 in the power to driver 108 occur while FET 102 is on, circuit 116 provides a discharge path that causes FET 102 to shut off in a relatively short amount of time—preventing it from draining source 104. Typically, circuit 116 takes the form of some sort of discrete, resistive element (e.g., a resistor). If such an element is a resistor—as is common—it generally cannot be bypassed or cut off during overstress testing. Unfortunately, the presence of such an element skews leakage current measurement of the gate of FET 102 during overstress testing. Furthermore, device-to-device variations and anomalies make it difficult to accurately quantify the amount of skew introduced by such an element.

The clamping structures 112 incorporated in many devices further complicate overstress testting As previously mentioned, clamping structures—such as a Zener diode— are often provided to ensure that the gate of FET 102 is limited to the maximum specified voltage (e.g., 5V, 12V, etc.) during normal operation. During overstress testing, however, the presence of such a structure can partially or completely inhibit the testing process. Furthermore, the application of an overstress voltage to the gate of FET 102 can damage the clamping structure 112—impairing the function and reliability of the device during normal operation.

Finally, the ability to perform the desired overstress testing requires a voltage supply capable of providing some multiple (e.g., 125%, 150%, 200%) of the specified maximum voltage. Overstress voltage is usually not provided by driver 108 because, to do so, an undesirable augmentation of the driver circuitry is typically required. Thus, a separate overstress voltage supply is provided. From a device real estate and efficiency perspective, a single overstress voltage supply that provides overstress voltage to multiple device segments is highly desirable.

The present invention comprehends these issues and addresses them with a system that provides and facilitates over-voltage testing of such devices in a highly efficient manner. Several aspects of the present invention are described beginning now with reference to circuitry segment 200, as illustrated in FIG. 2. For purposes of explanation and illustration, segment 200 is arranged in a low-side driver configuration. The teachings of the present invention, however, may also be applied to high-side driver circuitry, as well as other circuitry structures and configurations. Segment 200 is operationally activated by assertion of a control signal from source 202. Responsive to the signal from source 202, driver circuitry 204 provides power to the gate of FET 206 for cycling the FET on and off FET 206 is coupled to a current source 208 through a load 210. For purposes of explanation and illustration, source 208 is depicted as a battery and load 210 is depicted as an inductor. Depending upon the specific application, however, source 208 may comprise any suitable current source, and load 210 may comprise any number of loads exhibiting inductive or capacitive behaviors discussed herein. For purposes of explanation and illustration, FET 206 is depicted as an NMOS FET. Depending upon the specific application, however, FET 206 may comprise any suitable operational structure having its terminals (i.e., source, drain, gate) coupled in accordance with the teachings of the present invention. The drain of FET 206 is coupled to load 210, which may comprise any number of electronic devices or structures (e.g., lighting assembly, electromechanical systems, electronic media devices). The source of FET 206 is coupled to ground.

Driver 204 is coupled to ground and is powered by voltage supply 212. For purposes of explanation and illustration, supply 212 is hereafter referred to as a 12 Volt equivalent supply, unless otherwise stated. It should be understood, however, that suitable voltage supplies of a variety of values may be utilized in accordance with the present invention—depending upon the specific needs of a device or system. Supply 212 may be coupled directly or indirectly—to source 208, or it may be completely independent thereof A passive disabling structure 214 is intercoupled between the gate of FET 206 and ground. For purposes of explanation and illustration, structure 214 is depicted as a PMOS FET. Depending upon the specific application, however, structure 214 may comprise any suitable operational structure. The drain of FET 214 is coupled to ground, while its source is coupled to the gate of FET 206. The gate of FET 214 is coupled to overstress test circuitry 216.

In the embodiment depicted in, FIG. 2, FET 214 comprises a long channel PMOS device, of a substantially smaller size than that of FET 206. For example, the channel width-to-length ratio (W/L) of FET 214 may be somewhere in the range of 2/50, whereas the W/L of FET 206 may be somewhere in the range of 50000/2. Thus, the size of FET 214 is some fraction of the size of FET 206, even as much as several orders of magnitude smaller.

Referring now to FIG. 3, one embodiment of a subportion 300 of driver circuitry 204 is illustrated in greater detail. Portion 300 comprises an N-stage output structure. This structure may comprise a single stage, or a plurality of stages in series. As depicted in FIG. 3, portion 300 comprises a plurality of stages in series—first stage 302, second stage 304, on through the Nth stage 306. Node 308 is the final output node of this structure; serving as the output for driver 204. Stage 302 comprises a first MOS transistor 310, and a second MOS transistor 312, having their gates coupled together at node 314. The drain of transistor 312 is coupled to node 308, while its source is coupled to ground through current source 316. The drain of transistor 310 is coupled to node 308 through blocking structure 318, while its source is coupled to $V_{dd(N)}$ 320 through current source 322. Structurally, each subsequent stage (e.g., stages 304 and 306) is similar, although possibly differing in specific component parametric values (e.g., size, resistance, current). Furthermore, nodes 314 and 320 are, for each separate stage, coupled to different sources, as described in further detail hereafter.

Operationally, node 314 is coupled to a control signal that activates or deactivates its stage. For each stage, node 314 may be coupled to an independent signal source, or multiple nodes may be coupled to a cornrnon source. For stage 302, node 320 is coupled to some relatively small voltage supply (e.g., 3V, 5V) such that driver 204 switches FET 206 on quickly. Each subsequent stage is coupled to some incrementally higher voltage supply (e.g., 7V, 12V), up to the maximum voltage supply required (or allowed) from driver 204 ($V_{MAX}$) by the gate of FET 206. The number of subsequent stages required may be varied depending upon the value of $V_{MAX}$). For example, if $V_{MAX}$ is 12V, driver 204 may comprise only two driver. stages (e.g., 5V and 12V). Subsequent output stages thus provide a higher voltage supply while, for example, lowering output resistance and reducing or eliminating certain problems that can arise if only a single stage provided the maximum voltage. If, for each stage, node 314 is coupled to the same signal source, the stages may be activated simultaneously. If, for each stage, node 314 is coupled to a separate signal source, each subsequent stage may be activated after some interval of time has passed since activation of the previous stage.

Each stage incorporates a blocking structure 318. As depicted in FIG. 3, structure 318 is a Zener diode—although any suitable structure may be similarly employed. Structure 318 is provided to prevent the structures of driver 204 from back charging when the gate of FET 206 is taken above the value of supply 212.

Figure 4:
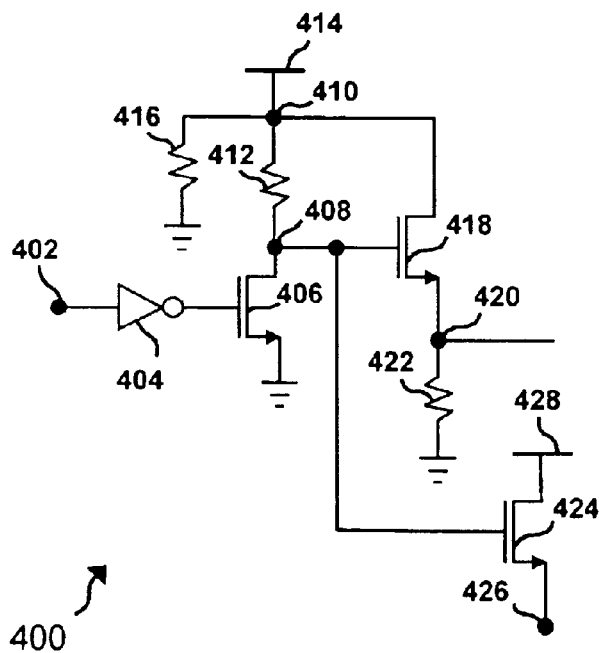
FIG. 4 is an illustration of one embodiment of an overstress test circuitry structure according to the present invention.

Referring now to FIG. 4, one embodiment of an overstress test structure 400 is illustrated. Structure 400 comprises an input node 402 that is coupled, for example, to node 202. Referring briefly back to FIG. 2, segment 200 is selected or activated by the control signal provided by source 202. Within structure 400, this control signal is provided to inverter 404. The output of inverter 404 is coupled to the gate of first transistor 406. The source of transistor 406 is coupled to ground, while its drain is coupled to node 408. Interposed between node 408 and node 410 is a first resistance element 412. Resistance element 412 may comprise any suitable structure (e.g., resistor) providing the necessary operational characteristics. Node 410 is coupled to a first voltage supply 414 of value ($V_{T1}$). A second resistance element 416 is intercoupled between node 410 and ground.

A second transistor 418 has its gate coupled to node 408, its drain coupled to node 410, and its source coupled to node 420. Node 420 couples to the gate of FET 214, as depicted in FIG. 2. A third resistance element 422 is intercoupled between node 420 and ground. A third transistor 424 has its gate coupled to node 408. The source of transistor 424 couples to node 426, which is coupled to the gate of FET 206. The drain of transistor 424 is coupled to a second voltage supply 428 of value ($V_{T2}$).

Operationally, structure 400 provides efficient overstress voltage and performs several advantageous functions. The operation of structure 400 is now described with joint reference to FIGS. 2 and 4. During the normal operation of a circuit (e.g., structure 200) to which it is coupled; structure 400 remains functionally transparent. Structure 400 is activated or enabled for overstress testing via node 402. As depicted in the embodiment illustrated in FIG. 4, node 402 is coupled to node 202 of FIG. 2, and inverter 404 is provided to render the proper control signal for structure 400 from the control signal 202 of structure 200. In alternative embodiments, a control signal to activate or enable structure 400 may be provided from an independent source (e.g., master test signal) to node 402, with or without inverter 404 included.

During normal operation of structure 200, the first voltage supply 414 and second voltage supply 428 of structure 400 are both disconnected (e.g., electrically, physically), and are thus held in a high impedance (high-Z) state. Transistor 406 may be turned on or off by the control signal provided via node 402. The resistance value of element 416 is relatively large (e.g., in the range of about 500 kΩ), to provide discharging of node 410 to ground. Nodes 408 and 410 are shorted together through element 412 and, thus, the gate and drain of transistor 418 are shorted together through element 412. With its gate coupled to node 408, which is coupled to ground through resistive element 412 and 416, transistor 424 is also off. With transistor 418 shut off, structure 400 leaves the gate of FET 214 coupled to ground through element 422. Thus, FET 214 is on and provides passive discharge protection to FET 206. By providing the described leakage paths to ground, transistors 418 and 424 remain in an off state during normal operation of circuit 200, regardless of the on or off state of transistor 406—rendering the presence of structure 400 operationally transparent to the device.

When overstress testing is initiated, a corresponding signal is cycled at node 402 and $V_{T1}$ and $V_{T2}$ are brought to appropriate voltage levels, and transistors 418 and 424 are made operational. $V_{T1}$ and $V_{T2}$ may be provided by separate voltage sources, or by some modification circuitry (e.g., step down circuit) coupled to a single voltage source.

A value for $V_{T2}$ is determined and set depending upon the desired overstress voltage ($V_{TEST}$) at the gate of FET 206. $V_{T2}$ is provided at a value equal to the desired value of $V_{TEST}$. $V_{T1}$ is-correspondingly provided at a level sufficient to ensure delivery of a voltage, greater than $V_{T2}$ plus the threshold voltage ($V_{(t)}$) of transistor 424, at the gate of transistor 424. $V_{T1}$ is provided at a level sufficiently greater than $V_{TEST}$ plus the threshold voltage drop $V_{(t)}$ across transistor 424 (i.e., $V_{T1}>V_{TEST}+V_{(t)}$). The amount by which $V_T$ exceeds $V_{TEST}$ plus $V_{(t)}$ is sufficient to cover device-to-device variations in $V_{(t)}$. For example, if $V_{(t)}$ is 1.8V, $V_{MAX}$ is 12V, and the desired $V_{TEST}$ is 18V (i.e., 150% of $V_{MAX}$), then $V_{T1}$ should be greater than 19.8V. Thus, for this example, it may be desirable that $V_{T1}$ be provided at a minimum 20V level. The gate of transistor 424 may thus be overdriven to ensure delivery of the full $V_{TEST}$ value to node 426.

$V_{T1}$ is further provided at a value sufficient to account for the drop across element 412 and provide sufficient voltage, via transistor 418, to node 420 to ensure that the potential at node 420 is higher than that at node 426. This deactivates FET 214 and substantially is eliminates its transient leakage current effects during overstress testing. It should be noted that, depending upon specific design characteristics, some nominal current might still leak through FET 214. Generally, however, this leakage current will be relatively miniscule in comparison to the leakage current through FET 206—enough so as to be negligible. Using the previous example, if $V_{T2}$ is provided at 18V, then $V_{T1}$ may be provided at, for example, 23V, depending upon the parametric values of various components (e.g., element 412, transistor 424) within structure 400.

Thus, utilizing the overstress test circuitry of the present invention, overstress testing of the gate oxide of FET 206 is. performed as follows. During normal operation, leakage current across the gate oxide is measured while overstress test structure 216 is held at normal operating levels (e.g., $V_{T2}=V_{MAX}$). The gate oxide is overstressed by some desired multiple of its maximum rated voltage (e.g., 150%, 200%, 300%). During this overstress, leakage current across the gate oxide is measured again. Due to the deactivation of FET 214, the overstress leakage current measurement provides an accurate characterization of that leakage current skewed only, if at all, by a negligible leakage through FET 214. Supply $V_{T2}$ is again set to its previous value (e.g., $V_{T2}=V_{MAX}$), returning the operation of FET 206 and structure 200 to normal operating voltages. The gate oxide leakage current is measured again. Differences between pre-overstress and post-overstress leakage currents may then be assessed to determine if they fall within some acceptable deviance. If so, the device is passed and utilized in production. If not, the device is rejected and not used.

Such a useful and accurate methodology greatly simplifies device production. Another useful aspect of the present invention provides a single test driver structure as the source of $V_{T1}$ and $V_{T2}$ across multiple intra-device instances of circuitry such as structure 200. As previously noted, $V_{T1}$ and $V_{T2}$ may be provided by separate voltage sources, or by some modification circuitry (e.g., step down circuit) coupled to a single voltage source, within this test driver structure. In this manner, overstress testing capabilities are provided to a number of operational circuits within a device while minimizing the space and performance overhead associated with providing overstress test power to the circuits.

Utilizing the principles and teachings of the present invention, a number of devices may be provided with overstress test capabilities—even where such capabilities were previously unavailable. The present invention is particularly applicable in a number of circuitry applications (e.g., charge pumps, capacitor-based oscillators) having a capacitive charge feedback path. The overstress test structure may be implemented in such applications to provide overstress testing while remaining functionally transparent during normal operation. Any and all such applications of the present invention are comprehended hereby.

The embodiments and examples set forth herein are presented to best explain the present invention and its practical application and to thereby enable those skilled in the art to make and utilize the invention. However, those skilled in the ant will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A circuit structure comprising:
    a first transistor, having a first terminal coupled to ground and a second terminal coupled to a first end of a load;
    a direct current source coupled to a second end of the load;
    a driver circuit coupled to a third terminal of the first transistor, adapted to provide a specified voltage to the third terminal of the transistor;
    a passive disabling structure intercoupled between the third terminal of the first transistor and ground; and
    an overstress test structure, having a first node coupled the passive disabling structure and a second node coupled to the third terminal of the first transistor.

2. The structure of claim 1, wherein the overstress test structure comprises a test control signal node.

3. The structure of claim 2, further comprising a control signal coupled jointly to an input of the driver circuit and the test control signal node of the overstress test structure.

4. The structure of claim 2, further comprising a first control signal source coupled to an input of the driver circuit, wherein the test control signal node of the overstress test structure is coupled to a second control signal source.

5. The structure of claim 1, wherein the first transistor comprises an NMOS FET.

6. The structure of claim 5, wherein the passive disabling structure comprises a PMOS FET.

7. The structure of claim 1, wherein the first transistor comprises a PMOS FET.

8. The structure of claim 7, wherein the passive disabling structure comprises an NMOS FET.

9. The structure of claim 1, wherein the load comprises an inductive load.

10. The structure of claim 1, wherein the direct, current source comprises a battery.

11. The structure of claim 1, wherein the passive disabling structure comprises a second transistor having a first terminal coupled to the first node of the overstress test structure.

12. The structure of claim 1, wherein the driver circuit comprises an output stage, the output stage comprising:
    a second transistor, having a first terminal coupled to ground through a first current source, a second terminal coupled to a control signal source, and a third terminal coupled to the third terminal of the first transistor;
    a blocking structure, having a first end coupled to the third terminal of the first transistor; and
    a third transistor, having a first terminal coupled to a second end of the blocking structure, a second terminal coupled to the second terminal of the second transistor, and a third terminal coupled to a voltage source through a second current source.

13. The structure of claim 12, comprising a plurality of output stages in series.

14. The structure of claim 13, wherein the voltage source of the first stage provides only a portion of the specified voltage.

15. The structure of claim 12, wherein the blocking structure comprises a Zener diode.

16. The structure of claim 1, wherein the overstress test structure comprises:
    a second transistor, having a first terminal coupled to ground, a second terminal coupled to a control signal source, and a third terminal coupled to a first end of a first resistive element;
    a first voltage source coupled to a second end of the first resistive element;
    a second resistive element intercoupled between the second end of the first resistive element and ground;
    a third transistor, having a first terminal coupled to the second end of the first resistive element, a second terminal coupled to the first end of the first resistive element, and a third terminal coupled to the first node;
    a third resistive element intercoupled between the first node and ground; and
    a fourth transistor, having a first terminal coupled to the second node, a second terminal coupled to the first end of the first resistive element, and a third terminal coupled to a second voltage source.

17. The structure of claim 16, wherein the first and second voltage sources are provided independently.

18. The structure of claim 16, wherein the second voltage source is provided via modification of the first voltage source.

19. An overvoltage test structure for providing overstress testing of an oxide structure, to which a passive disabling structure is coupled, the overvoltage test structure comprising:
    a first transistor, having a first terminal coupled to ground, a second terminal coupled to a control signal source, and a third terminal coupled to a first end of a first resistive element;
    a first voltage source coupled to a second end of the first resistive element;
    a second resistive element intercoupled between the second end of the first resistive element and ground;

a second transistor, having a first terminal coupled to the second end of the first resistive element, a second terminal coupled to the first end of the first resistive element, and a third terminal coupled to the passive disabling structure;

a third resistive element intercoupled between the third terminal of the second transistor and ground; and a third transistor, having a first terminal coupled to the oxide structure, a second terminal coupled to the first end of the first resistive element, and a third terminal coupled to a second voltage source.

20. The test structure of claim 19, wherein the first and second voltage sources are provided independently.

21. The test structure of claim 19, wherein the second voltage source is provided via modification of the first voltage source.

22. The structure of claim 19, wherein the control signal source is provided as an independent signal source.

23. The test structure of claim 19, further comprising an inverter intercoupled between the second terminal of the first transistor and a control signal source provided from a different structure.

24. A method of providing overvoltage testing of an oxide structure, to which a passive disabling structure is coupled, the method comprising the steps of:

providing a first transistor, having a first terminal coupled to ground, a second terminal coupled to a control signal source, and a third terminal coupled to a first end of a first resistive element;

providing a first voltage source coupled to a second end of the first resistive element;

providing a second resistive element intercoupled between the second end of the first resistive element and ground;

providing a second transistor, having a first terminal coupled to the second end of the first resistive element, a second terminal coupled to the first end of the first resistive element, and a third terminal coupled to the passive disabling structure;

providing a third resistive element intercoupled between the third terminal of the second transistor and ground;

providing a third transistor, having a first terminal coupled to the oxide structure, a second terminal coupled, to the first end of the first resistive element, and a third terminal coupled to a second voltage source; and utilizing a control signal provided by the control signal source to activate the first, second, and third transistors.

25. The method of claim 24, wherein the second voltage source is provided with a voltage greater than or equal to a desired test voltage for the oxide structure plus a threshold voltage of the third transistor.

26. The method of claim 24, wherein the first voltage source is provided with a voltage sufficient to drive the second terminal of the third transistor to a voltage greater than or equal to the voltage provided by the second voltage source.

27. A method of overvoltage testing an oxide structure, to which a passive disabling structure is coupled, the method comprising the steps of:

measuring leakage current through the oxide structure at a maximum specified voltage;

providing an overstress testing circuit adapted to provide an overstress voltage equivalent to some multiple of the maximum specified voltage;

utilizing the overstress testing circuit to apply the overstress voltage to the oxide structure;

measuring leakage current through the oxide structure while the overstress voltage is applied;

returning the oxide structure to the maximum specified voltage;

measuring leakage current through the oxide structure at the maximum specified voltage; and assessing the leakage currents measured to determine whether differences therebetween exceed some desired threshold.

* * * * *